United States Patent [19]

Blazick et al.

[11] 4,109,377

[45] Aug. 29, 1978

[54] METHOD FOR PREPARING A MULTILAYER CERAMIC

[75] Inventors: Linda Ann Blazick, Newburgh; Lewis Franklin Miller, LaGrangeville, both of, NY

[73] Assignee: International Business Machines Corporation, Armonk, N.Y.

[21] Appl. No.: 654,686

[22] Filed: Feb. 3, 1976

[51] Int. Cl.² ................... H05K 3/30; H05K 3/00
[52] U.S. Cl. ..................... 29/626; 29/576 J; 106/1.15; 106/1.21; 174/68.5; 228/121; 264/61; 264/65; 427/96; 427/126
[58] Field of Search ............ 29/625, 626, 576 J, 29/624; 228/121, 122, 123, 208, 209; 106/1, 1.12, 1.15, 1.21, 1.18; 427/96, 126; 264/61, 65; 174/68.5

[56] References Cited

U.S. PATENT DOCUMENTS

| | | | |
|---|---|---|---|
| 3,093,490 | 6/1963 | Mackey | 106/1 |
| 3,561,110 | 2/1971 | Feulner et al. | 29/625 X |
| 3,798,762 | 3/1974 | Harris et al. | 264/61 X |
| 3,815,187 | 6/1974 | Hanold | 29/625 X |
| 3,838,204 | 9/1974 | Ahn et al. | 29/625 X |

Primary Examiner—Francis S. Husar
Assistant Examiner—Gus T. Hampilos
Attorney, Agent, or Firm—George O. Saile

[57] ABSTRACT

A method for manufacturing a multilayer ceramic which is particularly suitable for carrying semiconductor chips. In order to join a semiconductor chip to a multilayer ceramic substrate, it is necessary that the projected site for the semiconductor chip be substantially flat. If there is a bulge, it becomes difficult to make a good joint thereto. The method involves depositing a particulate mixture containing a metal and the metal's oxide in a ratio of between 1:1 to 9:1 in a pattern on at least a portion of the plurality of ceramic layers. The patterns are then dried. The plurality of substrates or layers of ceramic are then laminated under substantial pressure and fired at an elevated temperature. The addition of the metal oxide to the metal powder allows the shrinkage of the metallization compound so that it may more nearly match that of the ceramic it is coated upon during the firing step. This matching of the shrinkage during firing prevents cracking of the ceramic.

16 Claims, 10 Drawing Figures

METHOD FOR PREPARING A MULTILAYER CERAMIC

BACKGROUND OF THE INVENTION

The invention relates to forming multilayer ceramic substrates and more particularly to metallizing compositions used on various levels within the multilayer ceramic body.

DESCRIPTION OF THE PRIOR ART

The sintering of a ceramic body is a function of many parameters including green or unfired ceramic sheet density, binder content and type, ceramic composition and particle distribution, firing conditions including ambient and actual temperature. A predictable shrinkage rate and final shrinkage percentage is attainable by a controlled set of these variables. It is, of course, essential to have a reproducible manufacturing process so that these variables can be controlled. Similar considerations apply to the conductive materials applied to the ceramic bodies. Composites of conductive materials and ceramics such as used in electronic modules show modified sintering behavior as a result of the constraints that the combination of ceramic materials and conductive materials put on each other during the firing process. For a relatively stress free, unwarped, strong composite, the shrinkage rates of the conductive or metal part and the ceramic part must be properly matched. For example, should the conductive part attain final shrinkage considerably before the ceramic part, the remaining ceramic shrinkage will add stress and probably produce undesirable cracks in the product. It is most desirable to have the shrinkage of the metal parts and the ceramic parts to be matched for the full time of firing.

The publication "Metal-Ceramic Constraints for Multilayer Electronic Packaging" by D. A. Chance and D. L. Wilcox in the Proceedings of the IEEE Volume 59, No. 10, Oct. 1971, pp. 1455–1462 considers the chemical and physical compatibility between the ceramic and metal parts which are cofired or sintered at elevated temperatures. It suggests that improper shrinkage design leads to cracks, camber of the sintered part, residual stresses and loss of metal-ceramic adhesion. The article suggests that changes in particle size distribution as well as metal loadings in the metal paste system may be used to obtain a well matched system.

Conductive metallizing compositions containing a refractory or noble metal and the refractory or noble metal's oxide have been known in the art such as in the U.S. Pat. No. 3,093,490 to R. J. Mackey. In this patent, a conductive metallizing composition of molybdenum and molybdenum trioxide is described wherein the composition also includes manganese.

SUMMARY OF THE PRESENT INVENTION

In accordance with the present invention, the use of a metal oxide powder with the metal powder for shrinkage adjustment allows an excellent shrinkage adjustment in the formation of multilayer ceramic substrates. Commonly used ceramics, such as aluminas, mullite, beryllias, titanates and steatites are usable as the ceramic component. Metallizing compositions which are useful include molybdenum, tungsten, and noble metals that can form oxides such as silver, and palladium. The metallization composition is adjusted by ratios of the metal oxide to the metal in the range of 1:1 to 1:9 depending upon the shrinkage condition of the ceramic to be cofired with the conductive composition. The particulate mixture containing the metal and metal oxide is deposited in a suitable pattern on at least a portion of the plurality of ceramic unfired or green ceramic layers or substrates which will make up the multilayer level ceramic substrate. The patterns are dried. The plurality of layers of ceramic are then laminated by stacking together and then applying a substantial pressure of an order of greater than about 2500 pounds per square inch thereto. The laminate is then fired at a elevated temperature and then cooled. The result is a multilayer ceramic substrate which is free of stresses, cracks and warpage. The fired metallurgy is dense and conductive.

DESCRIPTION OF THE PREFERRED EMBODIMENTS

A multilayer ceramic fabrication process involves the formation of the green or unfired ceramic layers or sheets, the formation of the conductive paste, the screening of the conductive paste onto the green ceramic sheets and the stacking, laminating and firing of the ceramic sheets into the final multilayer ceramic structure. These general processes are known in the art and are described in the publication entitled "A Fabrication Technique for Multilayer Ceramic Module", H. A. Kaiser et al, Solid State Technology, May 1972, pp. 35–40 and the Park U.S. Pat. No. 2,966,719.

The ceramic green sheet is formed by weighing out the proper portions of the ceramic powder and glass frit, and blending the particles by ball or other milling techniques. The organic binder comprising the thermoplastic resin, plasticizer and solvents is then mixed and blended with the ceramic and glass powders on a ball mill. A slurry or slip is cast into a tape form by extruding or doctor blading. The cast sheet is then allowed to be dried of the solvent constituent in the binder system. After the tape is completely dried, it is then cut into working blanks or sheets; registration holes are formed in the blanks together with the via holes which are selectively punched in the working blanks. The via holes will eventually be filled with conductive composition to allow for electrical connections from layer to layer in the multilayer ceramics structure.

Figure 1:
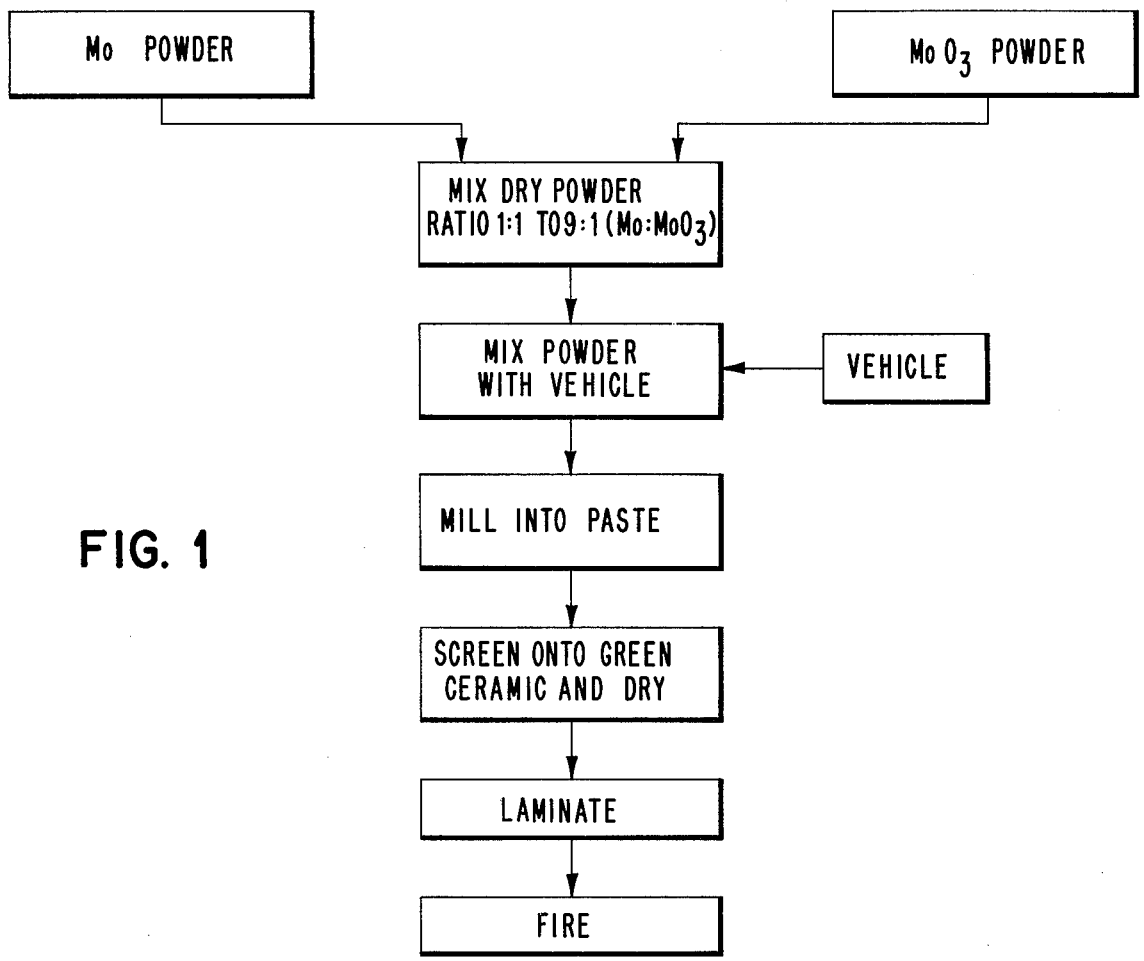
FIG. 1 is a flow chart illustrating the present invention.
Figure 2:
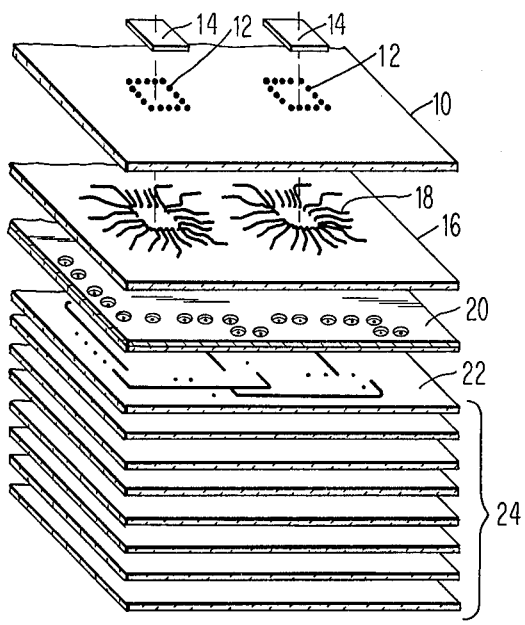
FIG. 2 illustrates an expanded stack of ceramic layers having metallization patterns in a multilayer ceramic structure.

The preparation of conductive paste and the remaining steps in the formation of a multilayer ceramic module or substrate may be understood with reference to FIGS. 1 and 2. The FIG. 1 flow chart shows the preferred metal and metal oxide embodiment wherein the molybdenum powder and molybdenum trioxide powder are mixed dry in the ratio of 1:1 to 1:9 molybdenum to molybdenum trioxide. The average preferred particle size for molybdenum is about 1.5 to 3.5 microns and molybdenum trioxide 2 to 5 microns. A suitable vehicle or solvent is mixed with the dry powder and then milled in a suitable mill such as a three-roll mill into a paste. The vehicle chosen must be one which may be given off at or below the firing or sintering temperature of the ceramic being utilized so that only the residual metallization remains after the process is completed. The conductive paste is then screened onto the green sheet to form the desired circuit patterns by the conventional silk screening techniques. Where it is desired to have electrical connections between the layers it is necessary to punch holes in the sheet prior to silk screening, and a second silk screening operation may be done to fill the via holes. Alternatively, one silk screening can be used to simultaneously coat the surface and force the paste into the via holes. Thereafter the paste is dried by placing the sheets in an oven and baking them at a rather low temperature, for example, 60°–100° C for 15–60 minutes, or the paste may be simply air dried.

FIG. 2 illustrates a plurality of layers of the ceramic having a variety of conductive patterns thereon which are being stacked in the proper sequence. The stack may be carefully registered using registration pins (not shown) so that all conductive lines from layer to layer are properly registered and aligned. The top or surface layer 10 is provided in the FIG. 2 example with two patterns 12 that are suitable for joining semiconductor chips 14 thereto. These particular chips are of the flip-chip or contacts down variety. The next level 16 has two conductive patterns 18 which connect through conductive via holes through the layer 10 to the conductive lines 18. Other via holes through the layer 16 make circuit connections to the succeeding layers 20, 22 and the remaining group of layers 24 so as to provide the required circuit connections for the input and output of signals to the semiconductor chips 14. These vias are between about 5 to 7 thousandths of an inch punched diameter and on centers about 10 to 12 thousandths of an inch.

The registered stack of green ceramic layers is placed in a laminating press. Moderate heat and pressure is applied. The preferred pressure for alumina ceramic is greater than 2500 psi and a temperature of about 80°–100° C. In this step, the thermoplastic binder in the green ceramic sheets softens and the layers fuse together, deforming around the metallized pattern to completely enclose the lines. The result is that the unfired stack will show no signs of individual layers. The stack of green sheets is then sawed or punched to the size of the finished module plus an allowance for shrinkage. The green module is fired in a suitable furnace wherein the module is raised from room temperature to a temperature greater than 1450° C at a rate of 140° C per hour and the furnace is then maintained at 1500°–1600° C for 1–5 hours for the firing of green ceramic. The firing ambient is wet hydrogen. The temperature is then reduced to room temperature at a rate of about 200° C/hr.

Figure 3A:
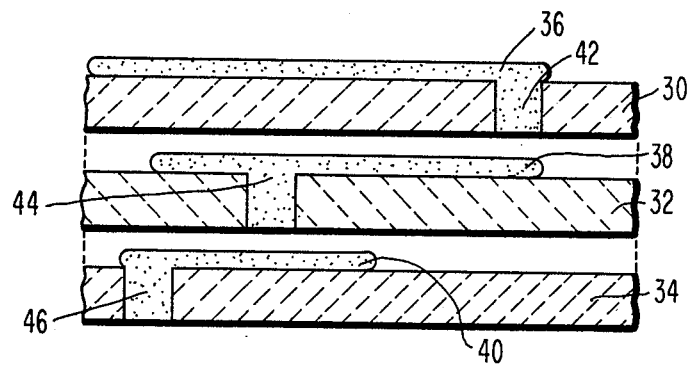
FIGS. 3A, 3B and 3C illustrate the steps involved in the lamination and firing of a multilayer ceramic substrate.
Figure 3B:
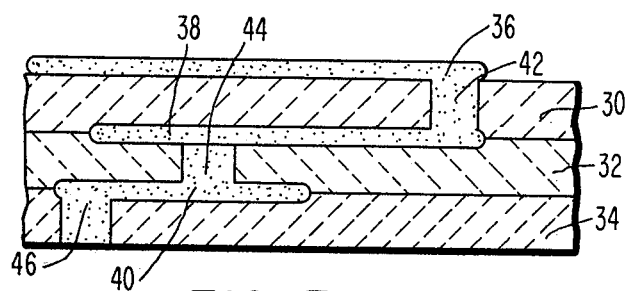
Figure 3C:
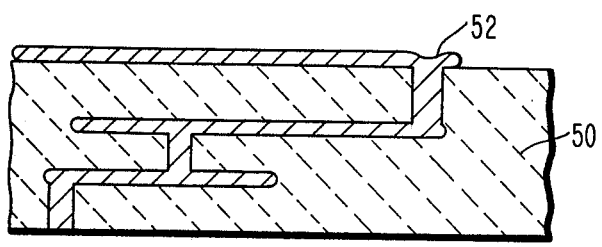

The effect of laminating and firing of a multilayer structure can better be appreciated with reference to FIGS. 3A, 3B and 3C. Three green, unfired ceramic layers 30, 32 and 34 are shown in FIG. 3A having conductive paste layers 36, 38 and 40 thereon. Also shown are via holes 42, 44 and 46 which are filled with conductive paste. The composite of FIG. 3A is laminated under pressure and temperature by which the thermoplastic nature of the green sheets causes the various layers to adhere to one another and produce a unitary body. Portions of the ceramic and the conductive paste are compressed where they come together. FIG. 3C illustrates the resulting multilayer ceramic structure following the firing step. This multilayer structure 50 has shrunk typically for alumina 16–18%. The resulting metallurgy 52 has most desirably also shrunk exactly that percentage so as to reduce stresses and cracks in the ceramic to the very minimum.

FIGS. 4A, 4B, 5, 6A, and 6B illustrate some of the failure modes for via conductive structures in multilayer ceramic modules.

Figure 4A:
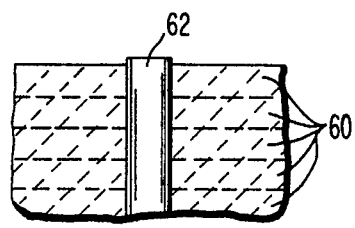
FIGS. 4A and 4B show via structures in a multilayer ceramic structure.
Figure 4B:
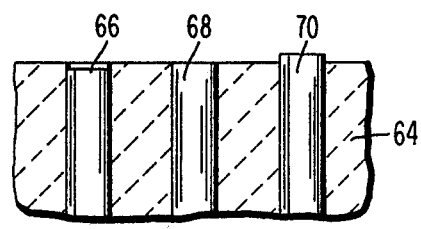
Figure 5:
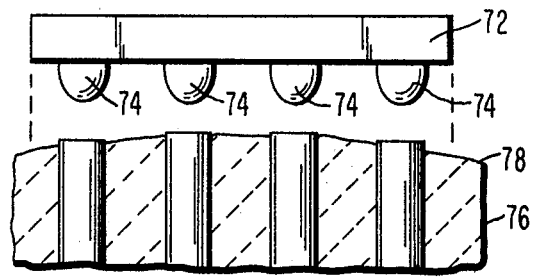
FIG. 5 shows a semiconductor chip site in a multilayer ceramic module.
Figure 6A:
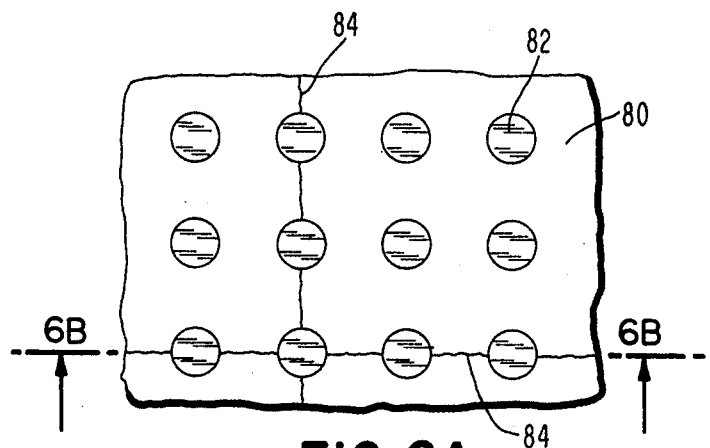
FIGS. 6A and 6B illustrates the problem of cracking between vias in multilayer ceramic substrates.
Figure 6B:
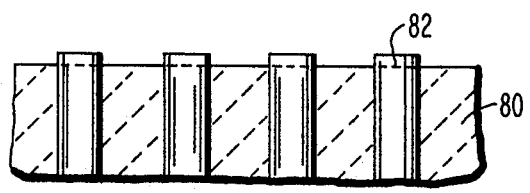

FIG. 4A shows an unfired laminated stack of ceramic layers 60 with via 62. FIG. 4B shows the fired structure wherein the unitary ceramic structure 64 contains three vias 66, 68 and 70. Via 66 is a negative via since the surface of the ceramic is above the top surface of the conductive via 66. The via 68 is a flush via since the top surface of the conductive via is at the same level as the top surface of the ceramic 64. The via 70 is a bulged or raised via since the conductive via top surface is slightly above the surface of the ceramic. The preferred via is 70 wherein a semiconductor chip 72 such as shown in FIG. 5 having conductive metal projections 74 extending therefrom is to be attached to the via on a multilayer ceramic module. Via 66 and 68 would not have the ability to make a good connection to the conductive projections of the semiconductor chip as the via 70 or to make good contact with electrical test probes. To obtain the structure such as via 70 the loading of the conductive paste with metal and metal oxide must be optimized.

FIG. 5 illustrates the joining of a semiconductor chip to the surface of a multi-layer ceramic module 76 wherein the surface 78 of the module is warped. This effect is caused by too much pressure from conductive layers within the multilayer ceramic module during the firing step. The resulting structure as can be seen from FIG. 5 will not satisfactorily join with the semiconductor metal pads 74. To alleviate this problem a substantial amount of metal oxide is incorporated into the metallized paste; as suggested in the above processing.

6A and 6B illustrate a multi-layer ceramic module 80 having a multiplicity of vias 82 therein. In this example, cracks 84 are shown between the vias which are caused by pressure between the metallurgy and the enclosing ceramic. The pressure is a function of the relative shrinkages during sintering, the expansion coefficients upon cooling, and material strength properties. Again, the solution for this problem is the incorporation of the substantial amount of metal oxide as described above.

It is known that various types of conductors are useful in multi-layer ceramic structures. It is most useful to have the metal having the greatest conductivity as the conductor within the multi-layer ceramic. However, some of the most conductive of the metals including copper and silver have relatively low melting points and this precludes their use when co-firing the ceramics that require higher sintering temperatures. For compatibility with high temperature ceramic materials commonly used in manufacture of multi-layer ceramics, metals with melting points in excess of 1450° C is required. Typically, the multilayer ceramic structures described are fired at temperatures sufficiently high to require the use of refractory conductive materials. However, as described in patent application Ser. No. 449,564, "Low Temperature Lo-K Ceramics", C. M. McIntosh, filed Mar. 8, 1974, lower firing bodies can be used which permit the similar use of silver and copper, with their oxides. Table I gives some of the properties of principal metals useful in multi-layer ceramic structures.

TABLE I

| Metal | Melting Point (° C) | Boiling Point (° C) | Density (g/cm³) | Electrical Resistivity (μohm . cm) | Thermal Expansion ($10^{-6}$/° C) | Approx. Cost ($/cm³) |
|---|---|---|---|---|---|---|
| Rhodium | 1966 | 4500 | 12.4 | 4.7 | 8.5 | 55.40 |
| Molybdenum | 2620 | 4507 | 10.2 | 5.7 | 5.0 | 0.10 |
| Tungsten | 3410 | 5900 | 19.35 | 5.5 | 4.5 | 0.23 |
| Nickel | 1453 | 2730 | 8.90 | 6.84 | 13.3 | |
| Ruthenium | 2450 | 4150 | 12.30 | 9.5 | 9.6 | 49.20 |
| Platinum | 1774 | 4300 | 21.45 | 10.6 | 9.0 | 123.00 |
| Palladium | 1549 | (3900) | 11.97 | 10.8 | 11.0 | 13.20 |

Table II gives the properties of certain ceramic materials which are usable as a ceramic in multi-layer ceramic materials. The Table gives some of the more significant dielectric properties of these in-organic insulators. It is important to as closely as possible match the thermal expansion co-efficient of the metal with the ceramic expansion co-efficient, particularly to further avoid the aforementioned cracks between the vias.

TABLE II

| Material | Resistivity at 25° C. (ohm . cm) | Dielectric Constant | tD/l $10^{-9}$s/in | Melting Point (° C) | Expansion Coefficient (25° C) (in/in° C) |
|---|---|---|---|---|---|
| $Al_2O_3$ | $10^{14}$ | 9.6 | 0.260 | 2072 | 7.3 |
| BeO | $10^{14}$ | 6.5 | 0.230 | 2565 | 8.0 |
| $ZrSiO_4$ | $10^{14}$ | 8.7 | 0.250 | 1775 | 4.0 |
| $MgAl_2O_4$ | $10^{12}$ | 8.5 | 0.246 | 2135 | 8.8 |
| $3Al_2O_3SiO_2$ | $10^{14}$ | 6.0 | 0.207 | 1840 | 5.3 |

The use of metal oxides together with the metal, for example, molytrioxide with molybdenum in a range of 1:1 to 9:1 moly: molytrioxide is helpful in matching ceramic shrinkage. The use of molytrioxide produces greater shrinkage in the metallurgy. This gives improved shrinkage control and prevents warping of the ceramic and reduces residual stresses in the ceramic which causes cracking and bulges within the multilayer ceramic structure. During the firing the metal oxide, such as molytrioxide, is reduced to molybdenum and the oxygen is evolved through the ceramic and to the ambient. The fired molybdenum resulting from pure molybdenum powder, and is useful in this type of electronic circuitry. The surrounding ceramic structure is also normal.

The following Examples are included merely to aid in the understanding of the invention and variations may be made by one skilled in the art without departing from the spirit and the scope of the invention.

EXAMPLE 1

Four multilayer ceramic modules were formed having 30 ceramic layers approximately 4 inches square. Of these layers, eight layers were substantially covered with metallizing to simulate ground or voltage distribution planes such as shown in FIG. 2 layer 20. The remaining layers consisted of line circuitry patterns. The densely covered eight layers dominate the metal/ceramic interaction and most directly affect shrinkage. The punched vias within the structure were 6 mils in diameter. The vias were simultaneously filled during the surface conductor screening process. Some of the vias went down directly through 28 layers. The ceramic utilized in the layer was a high purity alumina containing 400 grams of 89% alumina and 11% glass frit, with 25.4 grams of polyvinyl butyral* binder plasticized with 9.4 grams of a high molecular weight ester type plasticizer (dioctyl phthalate). The ceramic was made according to the process described in the aforesaid Kaiser et al publication. Etched metal masks having cavities of 25 to 60 microns and a total thickness of 2.5 to 3 mls were utilized to extrude the conductive paste by means of a squeegee. A molybdenum paste was utilzied with an average molybdenum particle size of 2.5 microns. The following were the four modules that were made with the variation in the paste on the eight dense layers involving only the percentage of solids. The result of the shrinkage is also given.
*Butvar B98

| | Shrinkage |
|---|---|
| Dummy (no paste on any layer) | 17.7% |
| 86% Solids | 16.6 – 16.7% |
| 80% Solids | 17.0% |
| 75% Solids | 17.16% |

The results indicate that high solids of pure molybdenum powder distinctly retards shrinkage. Lower solids content have less effect but are still assertive. For this series, each percentage of molybdenum between 75% and 86% retarded shrinkage about 0.05%.

EXAMPLE 2

The procedure of Example 1 was followed with the exception that the metal paste composition was varied in certain cases by the substitution of molybdenum trioxide for molybdenum. The average particle size of molybdenum was 2.5 microns and for the molybdenum trioxide it was 3.5 microns. The variations is shown in the following Table with the shrinkage results obtained:

| | Shrinkage |
|---|---|
| Dummy (no paste) | 17.7% |
| 86% Solids | 16.5 – 16.7% |
| 10% $MoO_3$, 85% Solids | 17.05% |
| 15% $MoO_3$, 80% Solids | 17.51% |

Molytrioxide has a significant effect on shrinkage improvement when substituted for the molybdenum metal as seen from the above results.

EXAMPLE 3

The process of Example 1 was repeated except for the variation in the molytrioxide content and the pressure during lamination as indicated in the following Table:

| | 2500 Psi | 3000 Psi |
|---|---|---|
| Dummy (no paste) | 17.56% | 17.4 % |

-continued

| | 2500 Psi | 3000 Psi |
|---|---|---|
| 25% MoO₃, 80% Solids | 17.54% | 17.39% |

As seen from the results above, for each percent of molytrioxide there is an increase in shrinkage of about 0.012%. The MoO₃ paste matched the shrinkage of the dummy.

EXAMPLE 4

The procedure of Example 1 was followed with the exception of the modification of varying the molybdenum metal powder size between 2.8 microns and 1.8 microns. The variation is shown in the following Table together with the shrinkage results.

| | | Shrinkage |
|---|---|---|
| Dummy | (no paste) | 17.74% |
| 85/15 | (2.8 /1.8) | 17.31 – 17.36% |
| 75/25 | (2.8 /1.8) | 17.22% |
| 50/50 | (2.8 /1.8) | 17.29% |

The results indicate no improvement in the variation of the ratio of 2.8 micron and 1.8 micron molybdenum powder.

EXAMPLE 5

The procedures of Example 1 were followed except a form of silk screen was utilized. This consisted of a pattern formed in a photosensitive emulsion which was coated on a 325 mesh stainless steel mesh. This mask is used for similar pattern forming purposes as etched metal or electroformed metal masks or stencils.

The following is a tabulation of the results depending upon the thickness of the emulsion screen utilized:

| | Shrinkage |
|---|---|
| Dummy (no paste) | 17.74% |
| Original Screen (2.8 mil) | 17.0 – 17.25% |
| Thin Screen (1.4 mil) | 17.0 – 17.16% |

There was no effect in using the various thicknesses of emulsion screens.

Examples 1–5 show that the unmetallized dummy shrinkage was best matched by the use of MoO₃ with molybdenum, in contrast to the paste solids loading or particle size, or even the thickness of the paste on the very dense pattern layers.

EXAMPLES 6–14

A 4 ceramic layer test specimen was utilized wherein the two middle layers had the above mentioned dense metallurgy pattern and the outside layers were 2 ceramic blanks. The procedure of Example 1 was utilized with the variations in vehicle type and percent of molybdenum trioxide as indicated in Table III.

TABLE III

| Example | Vehicle Type | Percent Powder | Percent MoO₃ | Paste Wt., Grams | Fired Shrinkage, Percent |
|---|---|---|---|---|---|
| 6 | — | — | — | — | 18.6 |
| 7 | 1 | 80 | 0 | 1.5 | 17.7 |
| 8 | 1 | 80 | 15 | 1.6 | 18.1 |
| 9 | 1 | 80 | 25 | 1.6 | 18.3 |
| 10 | 1 | 80 | 33 | 1.5 | 18.4 |
| 11 | 1 | 80 | 50 | 1.5 | 18.3 |
| 12 | 2 | 80 | 0 | 1.4 | 17.8 |
| 13 | 2 | 80 | 10 | 1.4 | 18.2–18.3 |
| 14 | 2 | 80 | 20 | 1.1 | 18.2–18.3 |

The compositions of the two vehicles utilized are given as follows:

Vehicle Type 1
  35 gelled linseed compound
  2.5 oleoyl sarkosine
  10 hydrogenated castor oil
  28.9 inkovar AB180 hydrocarbon resin
  18.3 Amsco 550 ink oil
  5.3 butyl carbitolacetate Vehicle Type 2
  20% N-50 ethyl cellulose
  80% butyl carbitol acetate This series again shows that the unmetallized part shrinkage (Example 6) is approached as more MoO₃ is used. Example 11 did not show the expected shrinkage increase compared to Example 10, and this is attributed to experimental error. Depending on the format, such a usage might be optimum at 20–33% MoO₃. This effect occurs whether polar vehicle type 2, or non-polar vehicle type 1 was used.

EXAMPLE 15

The shrinkage of the paste by itself was obtained by screening a dense pattern on paper, drying it, and then measuring specific fiducials on the pattern. The pattern was then fired in the same way as the multilayer ceramic, and the fired fiducials were remeasured. The shrinkage was the difference between the dried and fired dimensions.

| Paste Type | Percentage Shrinkage |
|---|---|
| Pure Mo | 13.5 – 14% |
| 10% MoO₃ | 17% |
| 25% MoO₃ | 21% |

This confirms that the MoO₃ addition substantially increases paste shrinkage, without the presence of ceramic.

EXAMPLE 16

The procedure of Example 1 was followed except that the dew point of the hydrogen gas in the sintering furnace was varied from 45° C to 55° C. The parts with 25% MoO₃ in the eight dense layers were less effected by the change in the firing ambient.

| Paste Type | Change in Shrinkage |
|---|---|
| Pure Mo | 1% |
| 25% MoO₃ | 0.2% |

EXAMPLE 17

The procedure of Example 1 was followed except that the paste in the vias in the layers 2–5 were varied to examine the effect on the top surface via bulge, and the presence of cracks between the top vias. The vias were 0055 inch diameter on 0.010 inch centers.

| Paste in Layers 2-5 | Top Surface Cracks | X-ray Stress | Via Bulge |
|---|---|---|---|
| Mo (85% Powder) | Many | 40-60,000 psi | .0010" |
| 10% MoO₃ (80% Powder) | Very few | 25,000 psi | .0006" |

This shows that the presence of the $MoO_3$ in the upper layers reduces surface cracks and bulging. The stress in the upper vias is substantially reduced by the presence of $MoO_3$. This is believed due to an improved sintering match and reduced solids content of the $MoO_3$ paste.

While the invention has been particularly shown and described with reference to the preferred embodiments thereof, it will be understood by those skilled in the art that the foregoing and other changes in form and details may be made therein without departing from the spirit and scope of the invention.

We claim:

1. In a method for preparing a multilayer ceramic for carrying semiconductor chips comprising:
   depositing a particulate mixture of a metal and a metal oxide thereof in the ratio of between about 1:1 to 9:1 in a pattern on at least a portion of unfired ceramic layers;
   said metal having high conductivity and a thermal expansion coefficient closely matched to said ceramic;
   drying said pattern;
   laminating the said plurality of layers of ceramic at a pressure greater than about 2500 pounds per square inch;
   firing the laminate at an elevated temperature in a non-oxidizing atmosphere; and
   cooling the resulting said multilayer ceramic to room temperature.

2. The method of claim 1 wherein said metal is molybdenum and said oxide is molybdenum trioxide.

3. The method of claim 1 wherein said metal is tungsten and said metal oxide is tungsten oxide.

4. The method of claim 1 wherein said metal is palladium and said metal oxide is palladium oxide.

5. In a method for preparing a multilevel ceramic for carrying semiconductor chips comprising:
   depositing a particulate mixture containing molybdenum and molybdenum trioxide in the ratio of between about 1:1 to 9:1 in a pattern on at least a portion of a plurality of unfired ceramic layers drying the pattern;
   laminating the said plurality of layers of ceramic at a pressure greater than about 2500 pounds per square inch;
   firing the laminate at an elevated temperature in a reducing atmosphere; and
   cooling the resulting said multilayer ceramic to room temperature.

6. The method of claim 5 wherein only the said ceramic substrates which have the most complex pattern of lines have said particulate mixture deposited thereon and the remaining said ceramic substrate have a particulate mixture containing molybdenum deposited therein on a pattern.

7. The method of claim 5 wherein the said ceramic substrates are composed of alumina.

8. The method of claim 7 wherein the said ceramic substrates have not been fired before said depositing step.

9. The method of claim 5 wherein the ratio of said mixture containing molybdenum and molybdenum trioxide is between about 1:1 to 9:1.

10. The method of claim 5 wherein said laminating pressure is less than about 4500 pounds per square inch.

11. The method of claim 5 wherein said firing is at a temperature above about 1450° C.

12. The method of claim 5 wherein the solids content of said particulate mixture is greater than about 75% by weight and less than about 80% by weight.

13. The method of claim 5 wherein the particle size of the molybdenum is about 1.5 to 3.5 microns and molybdenum trioxide is between about 2 to 5 microns.

14. The method of claim 5 wherein a plurality of vias containing molybdenum metal are located in the top surface of said multilevel ceramic and the said molybdenum metal in each via projects slightly above the surface of said top surface.

15. The method of claim 14 wherein a semiconductor chip is attached by solder reflow to at least several of said vias.

16. The method of claim 15 wherein the via size is between about 5 to 7 thousandths of an inch punched diameter and on center about 10 to 12 thousandths of an inch.

* * * * *